United States Patent [19]

Nelson et al.

[11] Patent Number: 4,743,782
[45] Date of Patent: May 10, 1988

[54] GaAs LEVEL-SHIFT LOGIC INTERFACE CIRCUIT

[75] Inventors: Roderick D. Nelson, Minneapolis, Minn.; Peter C. T. Roberts, Colorado Springs, Colo.; Tho T. Vu, Fridley, Minn.

[73] Assignee: Honeywell Inc., Minneapolis, Minn.

[21] Appl. No.: 670,107

[22] Filed: Nov. 9, 1984

[51] Int. Cl.[4] .................. H03K 17/30; H03K 17/687
[52] U.S. Cl. .................................. 307/475; 307/448; 307/450
[58] Field of Search ............... 307/443, 446, 448, 450, 307/475, 263

[56] References Cited

U.S. PATENT DOCUMENTS

| | | | |
|---|---|---|---|
| 4,393,315 | 7/1983 | Stickel et al. | 307/475 X |
| 4,412,336 | 10/1983 | Peltier et al. | 307/475 X |
| 4,488,064 | 12/1984 | Vance | 307/443 X |
| 4,491,747 | 1/1985 | Shimizu | 307/443 X |
| 4,496,856 | 1/1985 | Ransom et al. | 307/475 |

FOREIGN PATENT DOCUMENTS 117328  7/1984  Japan ................................. 307/475

OTHER PUBLICATIONS

Van Tuyl et al, "High-Speed Integrated Logic with GaAs MESFETs", pp. 269-276; *IEEE-JSSC*, vol.-S-C-9, No. 5, 10/1974.

*Primary Examiner*—Stanley D. Miller
*Assistant Examiner*—D. R. Hudspeth
*Attorney, Agent, or Firm*—William T. Udseth; John G. Shudy, Jr.

[57] ABSTRACT

A very high speed, low power integrated interface circuit using GaAs or InP technology is provided for converting small digital voltage swings to larger swings which are particularly suitable for analog control signals. The preferred embodiments employ solely depletion mode MESFETS and Schottky diodes in Schottky diode field effect logic (SDFL) configurations.

5 Claims, 2 Drawing Sheets

GaAs LEVEL-SHIFT LOGIC INTERFACE CIRCUIT

BACKGROUND OF THE INVENTION

1. Field of the Invention

This invention relates to gallium arsenide (GaAs) or indium phosphide (InP) integrated circuits for shifting low logic levels characteristic of high speed digital components (such as ECL or GaAs memories) to large swings suitable for analog control signals. In particular this invention relates to such GaAs or InP circuits employing only depletion mode metal-semiconductor field effect transistors (MESFETS) and Schottky diodes in Schottky diode field effect transistor logic (SDFL) configuration.

2. Prior Art

The high switching speeds available with GaAs integrated circuits have been advantageously employed in a logic circuit approach called SDFL as disclosed in U.S. Pat. No. 4,300,064 issued to Eden. Further, Ransom, et al in U.S. Pat. No. 4,410,815 disclose a high speed GaAs integrated circuit which converts the relatively low GaAs input or source signals to voltage levels for directly driving ECL circuits. Ransom, et al input true and complement logic signals through Schottky diode level shifting networks to generate dual inputs to a depletion mode MESFET differential amplifier which in turn drives a depletion mode MESFET source follower output stage. Logic level converters or interfaces which require true and complement logic signals for operation require gates to invert the true signal. The added gates take up additional space, complicate chip processing and can slow the throughput of logic signals in the circuit.

Heretofore, however, no GaAs or InP integrated circuit has been disclosed which effectively utilizes the inherent speed capability of GaAs or InP to provide drive voltages particularly suited for analog devices wherein both true and complement logic signals are not needed as the input signal to the interface circuit.

SUMMARY OF THE INVENTION

The present invention is a solid state monolithic integrated circuit, comprising a GaAs or InP substrate, means for converting the logic levels of digital input signals having a relatively low logic voltage swing (e.g., ECL or GaAs memories) to digital signals having a larger voltage swing, and means for amplifying the second voltage swing to a value appropriate for driving, preferably, an analog device. The logic converting means is further characterized by the requirement that only one digital signal is input at a time.

DESCRIPTION OF THE PREFERRED EMBODIMENTS

MESFET as used herein refers to the commonly recognized structure of a metallic gate (or gates) overlying a semiconductor or semi-insulating substrate between ohmic source and drain contacts. The substrate is selected to provide a flow of majority carriers between the source and drain contacts upon the application of a sufficient potential difference between the contacts. The flow of majority carriers is controlled by the potential difference between the gate and the substrate. Doped regions of a first conductivity type are provided beneath each of the source and drain contacts. The substrate is doped with a second conductivity type. The channel region beneath the metallic gate is a region of either the first or second conductivity type. The polarity of the gate potential relative to the source potential is used to either enhance or deplete charge carriers in the channel region. As is well known, this provides for enhancement and depletion mode devices.

Figure 1:
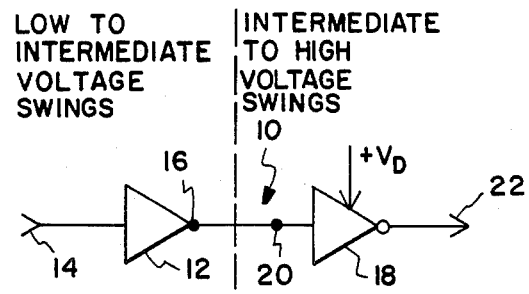
FIG. 1 is a logic symbol diagram of a first embodiment of the present invention.

FIG. 1 displays circuit 10 comprised of a means 12 for converting digital input signals having a low voltage swing to second digital signals having a larger, intermediate voltage swing, and of a means 18 for amplifying the second digital signals to a larger output signal. The input to converting means 12 is node 14 and its output is node 16. The input of amplifying means 18 is node 20 and its output is node 22. Circuit 10 will process only one digital signal at a time.

Figure 2:
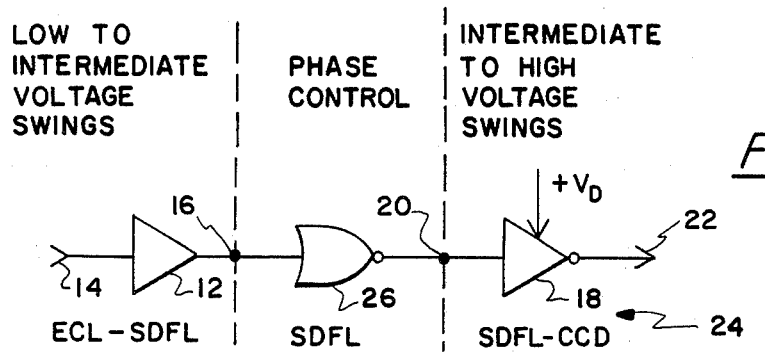
FIG. 2 is a logic symbol diagram of a second embodiment of the present invention.

FIG. 2 displays a circuit 24 wherein circuit 10 is expanded. Corresponding structure in circuits 10 and 24 is like-numbered. Circuit 24 addes to circuit 10 a third means 26 for controlling the phase of digital signals received from converting means 12. FIG. 2 conveniently shows phase control means 26 as a NOR gate. Various embodiments of the present invention will typically invert digital signals several times between input 14 and output 22, and phase control means 26 explicitly depicts a means which can be utilized to control the phase of the output at node 22 but which does not materially affect the magnitude of the digital signal.

Figure 3:
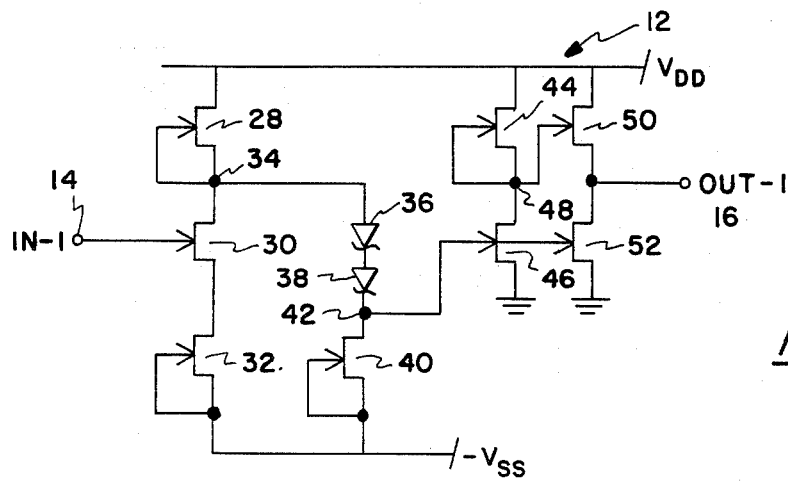
FIG. 3 is a schematic of a portion of an input buffer advantageously utilized in the present invention.
Figure 4:
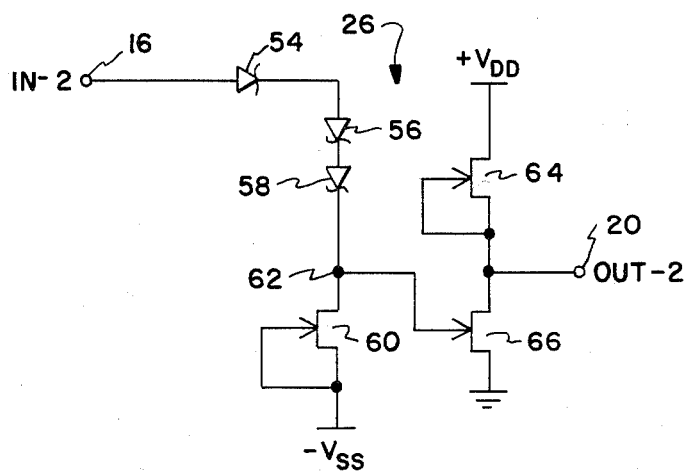
FIG. 4 is a schematic of a SDFL NOR gate advantageously utilized as a phase control in the present invention.
Figure 5:
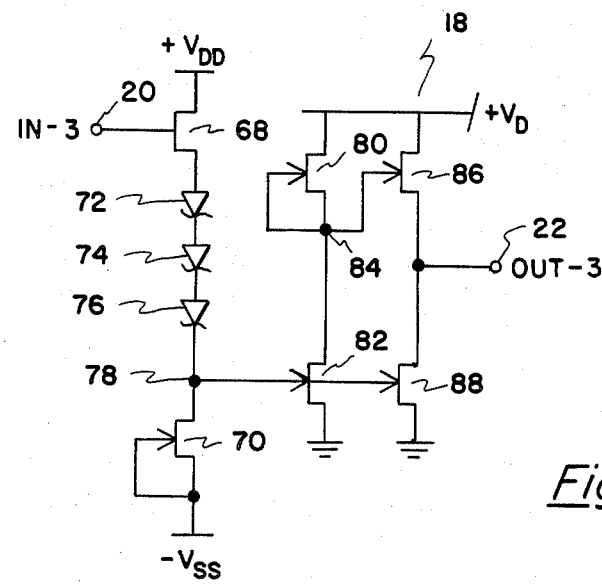
FIG. 5 is a schematic of a SDFL output buffer advantageously utilized in the present invention.

Converting means 12, phase control means 26 and amplifier means 18 are part of an integrated circuit on a GaAs or InP substrate. This integrated circuit is conveniently implemented with SDFL circuits and Schottky diodes as shown in FIGS. 3, 4 and 5. By way of example in FIG. 2, converting means 12 is depicted as converting ECL digital signals with SDFL to logic signals to intermediate voltage swing. By way of further example, phase control in FIG. 2 is provided by means 26 configured as a SDFL NOR gate and means 18 amplifies SDFL digital signals to values suitable for driving a charge coupled device (CCD) analog device.

Converting means 12 in FIG. 3 comprises: a first inverter including depletion mode MESFETS 28, 30 and 32 with an output at node 34; a first voltage level shifting means including Schottky diodes 36 and 38, and depletion mode MESFET 40 with an output at node 42; a second inverter including depletion mode MESFETS 44 and 46 with an output node 48; and an optional push-pull output buffer including depletion mode MESFET 50 operating as a source follower and depletion mode MESFET 52 operating as a pull down transistor, with the final output of converting means 12 generated at node 16.

The input to phase control means 26 of FIG. 4 is node 16. Phase control means 26 further comprises a second voltage level shifting means including Schottky diodes 54, 56 and 58, and depletion mode MESFET 60 with its output at node 62; and a third inverter including depletion mode MESFETS 64 and 66 with its output at node 20.

Amplifying means 18 in FIG. 5 receives its input at node 20 and comprises: third voltage level shifting means including depletion mode MESFETS 68 and 70, and Schottky diodes 72, 74 and 76 with the output at node 78; fourth inverter/amplifier including depletion mode MESFETS 80 and 82 with the output at node 84; and optional source follower depletion mode MESFET 86 with pull down depletion mode MESFET 88 and the output at node 22. Three different voltage supplies will generally be employed in circuits 10 or 24. These are $V_{DD}$, $V_D$ and $-V_{SS}$. $V_D$ and $V_{DD}$ are both positive with $V_D$ being the larger of the two.

SDFL circuitry and the circuits of FIGS. 3, 4 and 5 are not the only circuits capable of performing the functions of circuits 10 and 24 in FIGS. 1 and 2. Other circuits which perform the functions indicated in FIGS. 1 and 2 and which are compatible with GaAs or InP could be utilized. Further, circuits 10 or 24 modified to accommodate other transistors compatible with GaAs or InP could be employed.

The operation of circuits 10 and 24 utilizing the schematics of FIGS. 3, 4 and 5 will now be described. For convenience, voltage levels and supply voltages suitable for converting typical ECL inputs to drive voltages for a CCD sampled data system will be used by way of example. Circuits 10 and 24 can be adapted to process other voltage levels typical of ECL circuits or CCD devices, or process digital signals from other digital logic families, and such circuits can be adapted to drive other analog or digital devices with different voltage drive requirements. By adjusting the voltage supplies, and in particular $V_D$, the voltage amplification factor of circuits 10 and 24 can be altered within the operational limits of the MESFETS or other transistors being employed.

Although circuits 10 and 24 process only one digital signal at a time, the circuit operation example will indicate the high and low voltage value of digital logic signals at each stage as they proceed through circuits 10 and 24. The supply voltages of the example below are approximately: $V_D$ 4 volts, $V_{DD}$ 2.5 volts and $V_{SS}$ $-1.5$ volts.

ECL digital logic signals input at node 14 (see FIG. 3) typically have a voltage swinging between approximately $-0.5$ volts to $-2$ volts. MESFETS 28, 30 and 32 invert the ECL digital signal and output digital signals with a voltage swing between 2 volts and 0.3 volts at node 34. The magnitude of the positive voltage level shift provided by MESFETS 28, 30 and 32 is proportional to the ratio of the size of the current source MESFETS 28 and 32. The voltage level of the digital signals at node 34 is lowered by diodes 36 and 38 (which are kept forward biased by current source MESFET 40) by about 1.4 volts to 0.6 volts and $-0.9$ volts at node 42.

MESFETS 44 and 46 invert the digital signals at node 42 and generate an output swinging from 0.3 volts to 2.5 volts at node 48. Source follower MESFET 50 and pull down MESFET 52 pass these same voltage levels onto output node 16. MESFETS 50 and 52 are optional and are employed generally when additional driving current is needed to increase fan-out.

Node 16 serves as the input to phase control means 26 of FIG. 4. Therefore a voltage swing of 0.3 volts to 2.5 volts is input at node 16. Schottky diodes 54, 56 and 58 (in conjunction with current source MESFET 60) lower the voltage level of the digital signals to approximately $-1.2$ volts and 1 volt at node 62. MESFETS 64 and 66 again invert the digital signals and provide a voltage swinging from 0.5 volts to 2.5 volts at node 20.

Amplifier means 18 of FIG. 5 first lowers the voltage level of signals input to node 20 and then generates logic levels of approximately $-0.8$ volts and 0.4 volts at node 78. Thereafter, MESFETS 80 and 82 in conjunction with the larger voltage supply $V_D$ invert the logic signals at node 78 and amplify the voltage swing to generate a low logic signal at node 84 of 0.5 volts and a high logic signal of 3.75 volts. Source follower MESFET 86 and pull down MESFET 88 pass these digital signals onto output node 22. Note in the above example that the output at node 22 is in phase with the input at node 14. If phase control means 26 were not used, the output would be 180° out of phase with the input.

Figure 6:
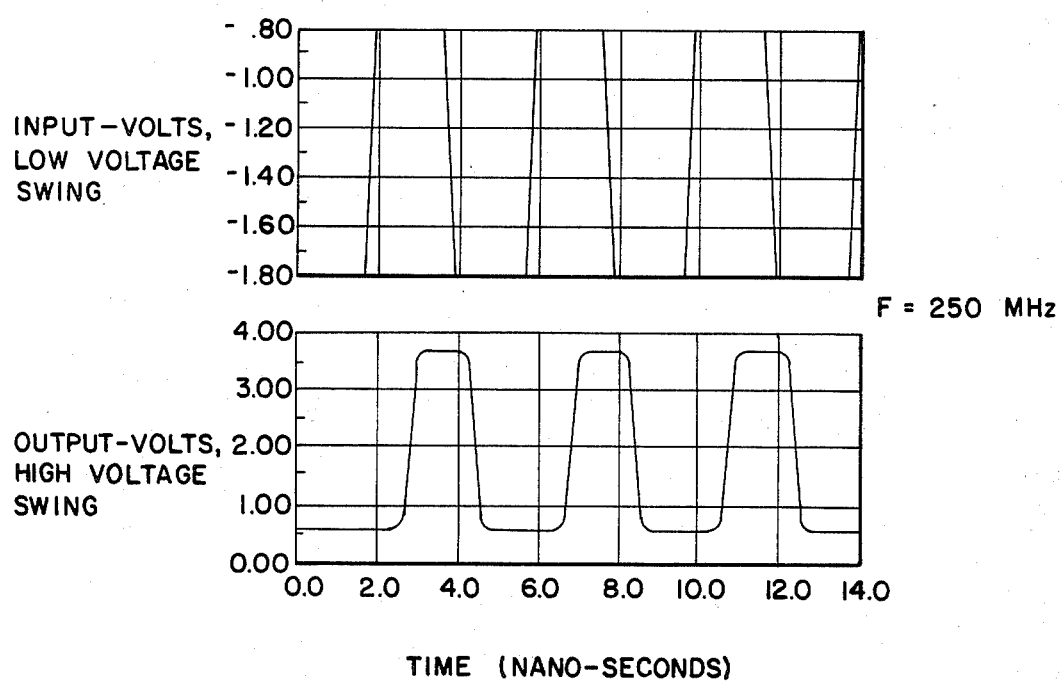
FIG. 6 is a plot of input and output voltage signals as a function of time from a computer simulation of the present invention wherein the schematics of FIGS. 3, 4 and 5 are employed.

Results of a SPICE computer simulation of the operation of the schematics of FIGS. 3, 4 and 5 is shown in FIG. 6. The substrate is GaAs. The voltage levels of the above example are approximately the same as employed in the computer simulation. The data in FIG. 6 demonstrates that an initial voltage swing of just over 1 volt between negative voltage levels from an ECL circuit results in a 3.25 voltage swing between positive voltage levels at a frequency of 250 MHz. The propogation delay between input 14 and output 22 is also shown in FIG. 6 to be just slightly more than one nanosecond.

As stated above, the output voltage swing can be adjusted by adjusting the voltage supply (and in particular $V_D$) as well as by selecting different MESFETS. However, a 10 volt swing is a practical maximum due to device breakdown limitations.

What is claimed is:

1. A solid state monolithic integrated circuit, comprising:
   a substrate of a material selected from the group consisting of gallium arsenide and indium phosphide;
   an input node;
   means for converting the logic levels of digital input signals having a first voltage swing to second digital signals having a second voltage swing, wherein said second voltage swing has a larger magnitude than said first voltage swing, said converting means is integral with said substrate and receives only one digital input signal at a time, and said converting means includes two cascaded single input stages, with each of said stages including a switching metal-semiconductor field effect transistor (MESFET) having a control gate, wherein said control gate of the first of said stages is connected to said input node, and the output of the first of said stages is applied to said gate of said MESFET in the second of said stages to control the flow of current in said MESFET in said second of said stages; and
   means for amplifying said second digital signals, coupled to said second of said stages.

2. The circuit of claim 1, further comprising means for inverting said second digital signals prior to amplification of said second digital signals by said amplifying means.

3. A solid state monolithic integrated circuit, comprising:
  a substrate of a material selected from the group consisting of gallium arsenide and indium phosphide;
  means for converting the logic levels of digital input signals having a first voltage swing to second digital signals having a second voltage swing, wherein said second voltage swing has a larger magnitude than said first voltage swing, said converting means is integral with said substrate and receives only one digital input signal at a time, said converting means including:
    first means for inverting said digital input signal to a first digital inverted signal,
    first means for shifting the voltage level of said first digital inverted signal to a first digital shifted signal,
    second means for inverting said first digital shifted signal to a second digital inverted signal,
    second means for shifting the voltage level of said second digital inverted signal to a second digital shifted signal,
    third means for inverting said second digital shifted signal to a third digital inverted signal,
    third means for shifting the voltage level of said third digital inverted signal to a third digital shifted signal, and
    fourth means for inverting said third digital shifted signal to a fourth digital inverted signal being said second digital signals; and
  means for amplifying said fourth digital inverted signal to generate an amplified digital signal having a third voltage swing with a magnitude greater than the magnitude of said second voltage swing.

4. The circuit of claim 3 wherein said circuit is connected to first and second voltage supplies and a voltage reference point, and wherein:
  said first inverting means includes first, second and third depletion mode metal semiconductor field effect transistors (MESFETS) each having a drain, a gate and a source, wherein the drain of said first MESFET is connected to said first voltage supply, and the source of said first MESFET is connected to the gate of said first MESFET and to the drain of said second MESFET, the gate of said second MESFET receives said digital input signals, the source of said second MESFET is connected to the drain of said third MESFET, and the source of said third MESFET is connected to the gate of said third MESFET and to said second voltage supply;
  said first voltage level shifting means includes first and second Schottky diodes connected in series;
  said second inverter means includes fourth and fifth depletion mode MESFETS each having a drain, a gate and a source, wherein the drain of said fourth MESFET is connected to said first voltage supply, the source of said fourth MESFET is connected to the gate of said fourth MESFET and to the drain of said fifth MESFET, the source of said fifth MESFET is connected to said voltage reference point, and the gate of said fifth MESFET is connected to the output of said first voltage level shifting means;
  said second voltage level shifting means includes third, fourth and fifth Schottky diodes connected in series;
  said third inverter means includes sixth and seventh depletion mode MESFETS each having a drain, a gate and a source, wherein the drain of said sixth MESFET is connected to said first voltage supply, the source of said sixth MESFET is connected to the gate of said sixth MESFET and to the drain of said seventh MESFET, the gate of said seventh MESFET is connected to the output of said second voltage level shifting means and the source of said seventh MESFET is connected to said voltage reference point;
  said third voltage level shifting means includes sixth, seventh and eighth Schottky diodes connected in series;
  said fourth inverter means includes eighth and ninth depletion mode MESFETS and said amplifier means also includes said eighth and ninth depletion mode MESFETS each having a drain, a gate and a source, wherein the drain of said eighth MESFET is connected to said first voltage supply, the source of said eighth MESFET is connected to the gate of said eighth MESFET and to the drain of said ninth MESFET, the gate of said ninth MESFET is connected to the output of said third voltage level shifting means and the source of said ninth MESFET is connected to said voltage reference point.

5. The circuit of claim 3 wherein
  the logic levels of said digital input signals are derived from an emitter coupled logic (ECL) integrated circuit; and
  said amplifying means is used to drive an analog electrical device.

* * * * *